(12) United States Patent
Andrews et al.

(10) Patent No.: US 9,041,042 B2
(45) Date of Patent: May 26, 2015

(54) HIGH DENSITY MULTI-CHIP LED DEVICES

(75) Inventors: Peter Scott Andrews, Durham, NC (US); Raymond Rosado, Apex, NC (US); Michael P. Laughner, Cary, NC (US); David T. Emerson, Chapel Hill, NC (US); Amber C. Abare, Durham, NC (US); Jeffrey C. Britt, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/017,502

(22) Filed: Jan. 31, 2011

(65) Prior Publication Data
US 2012/0068198 A1 Mar. 22, 2012

Related U.S. Application Data

(60) Provisional application No. 61/384,623, filed on Sep. 20, 2010, provisional application No. 61/390,963, filed on Oct. 7, 2010.

(51) Int. Cl.
*H01L 33/62* (2010.01)
*H01L 25/075* (2006.01)
*H01L 33/58* (2010.01)

(52) U.S. Cl.
CPC ............ *H01L 25/0753* (2013.01); *H01L 33/62* (2013.01); *H01L 2224/48091* (2013.01); *H01L 33/58* (2013.01)

(58) Field of Classification Search
CPC ..... H01L 33/48; H01L 33/483; H01L 33/486; H01L 33/62; H01L 33/64; H01L 33/642; H01L 25/075; H01L 25/0753
USPC .............. 257/79, 99, 100, E33.056–E33.059; 438/26–28, 34, 22
See application file for complete search history.

(56) References Cited

U.S. PATENT DOCUMENTS 4,963,933 A * 10/1990 Brownlee ...................... 399/186
5,187,377 A * 2/1993 Katoh .............................. 257/89
(Continued)

FOREIGN PATENT DOCUMENTS

DE 112004000864 T5 4/2006
DE 102007020011 A1 10/2007
(Continued)

OTHER PUBLICATIONS

Cree, Inc., International Application No. PCT/US2011/052103, International Search Report and Written Opinion, Dec. 6, 2011.
(Continued)

*Primary Examiner* — Michele Fan
(74) *Attorney, Agent, or Firm* — Steven B. Phillips; Moore & Van Allen PLLC

(57) ABSTRACT

High density multi-chip LED devices are described. Embodiments of the present invention provide high-density, multi-chip LED devices with relatively high efficiency and light output in a compact size. An LED device includes a plurality of interconnected LED chips and an optical element such as a lens. The LED chips may be arranged in two groups, wherein the LED chips within each group are connected in parallel and the groups are connected in series. In some embodiments, the LED device includes a submount, which may be made of ceramic. The submount may include a connection bus and semicircular areas to which chips are bonded. Wire bonds can be connected to the LED chips so that all the wire bonds are disposed on the outside of a group of LED chips to minimize light absorption.

21 Claims, 15 Drawing Sheets

(56) References Cited

U.S. PATENT DOCUMENTS

| | | | |
|---|---|---|---|
| 5,226,723 A * | 7/1993 | Chen | 362/241 |
| 5,600,363 A * | 2/1997 | Anzaki et al. | 347/237 |
| 7,213,940 B1 | 5/2007 | Van De Ven et al. | |
| D615,504 S | 5/2010 | Keller et al. | |
| 7,709,856 B2 * | 5/2010 | Tsukagoshi | 257/100 |
| 7,771,081 B2 | 8/2010 | Kim et al. | |
| 7,960,744 B2 * | 6/2011 | Seo et al. | 257/89 |
| 7,988,336 B1 | 8/2011 | Harbers et al. | |
| 8,075,165 B2 | 12/2011 | Jiang et al. | |
| 8,109,644 B2 | 2/2012 | Bierhuizen | |
| 8,231,251 B2 | 7/2012 | Eng et al. | |
| 8,348,456 B2 | 1/2013 | Satou et al. | |
| 2004/0129944 A1 * | 7/2004 | Chen | 257/89 |
| 2004/0129946 A1 * | 7/2004 | Nagai et al. | 257/98 |
| 2004/0208210 A1 * | 10/2004 | Inoguchi | 372/36 |
| 2005/0035357 A1 * | 2/2005 | Fjelstad | 257/81 |
| 2005/0156189 A1 * | 7/2005 | Deguchi et al. | 257/103 |
| 2005/0230853 A1 * | 10/2005 | Yoshikawa | 257/E25.032 |
| 2007/0063321 A1 * | 3/2007 | Han et al. | 257/675 |
| 2007/0085944 A1 | 4/2007 | Tanaka | |
| 2008/0035947 A1 * | 2/2008 | Weaver, Jr. et al. | 257/99 |
| 2008/0099772 A1 * | 5/2008 | Shuy et al. | 257/88 |
| 2008/0170391 A1 | 7/2008 | Norfidathul et al. | |
| 2008/0179618 A1 | 7/2008 | Cheng | |
| 2008/0210963 A1 * | 9/2008 | Lin et al. | 257/98 |
| 2009/0020778 A1 * | 1/2009 | Noichi | 257/99 |
| 2009/0050908 A1 | 2/2009 | Yuan et al. | |
| 2009/0101921 A1 * | 4/2009 | Lai | 257/88 |
| 2009/0134415 A1 | 5/2009 | Morioka | |
| 2009/0283787 A1 | 11/2009 | Donofrio et al. | |
| 2010/0025697 A1 * | 2/2010 | Kawamura | 257/81 |
| 2010/0072491 A1 * | 3/2010 | Wang | 257/88 |
| 2010/0079997 A1 * | 4/2010 | Morikawa et al. | 362/249.01 |
| 2010/0084681 A1 * | 4/2010 | Nakajima et al. | 257/99 |
| 2010/0103660 A1 | 4/2010 | Van De Ven et al. | |
| 2010/0117099 A1 | 5/2010 | Leung | |
| 2010/0133552 A1 * | 6/2010 | Cheng et al. | 257/88 |
| 2010/0140633 A1 | 6/2010 | Emerson | |
| 2010/0176751 A1 * | 7/2010 | Oshio et al. | 315/362 |
| 2010/0244072 A1 * | 9/2010 | Kim | 257/98 |
| 2011/0001156 A1 * | 1/2011 | Matsuda et al. | 257/98 |
| 2011/0085352 A1 | 4/2011 | Ito et al. | |
| 2011/0175536 A1 * | 7/2011 | Fujita et al. | 315/185 R |
| 2011/0291124 A1 * | 12/2011 | DeSamber et al. | 257/88 |
| 2011/0316011 A1 * | 12/2011 | Ito et al. | 257/88 |

FOREIGN PATENT DOCUMENTS

| | | |
|---|---|---|
| JP | 2007-140453 A | 6/2007 |
| JP | 2010205920 A * | 9/2010 |
| WO | 2009145298 A1 | 12/2009 |
| WO | WO 2009/148483 A1 | 12/2009 |

OTHER PUBLICATIONS

Cree, Inc., International Application No. PCT/US2011/052102, International Search Report and Written Opinion, Dec. 6, 2011.

Cree, Inc. et al., International Application No. PCT/US2011/052102, International Preliminary Report on Patentability, Mar. 26, 2013.

Cree, Inc. et al., International Application No. PCT/US2011/052103, International Preliminary Report on Patentability, Mar. 26, 2013.

Cree, Inc., U.S. Appl. No. 13/017,407, Office Action, Feb. 15, 2013.

Cree, Inc., Taiwanese Application No. 100133870, Office Action, Oct. 24, 2013.

Cree, Inc., Taiwanese Application No. 100133831, Office Action, Dec. 24, 2013.

Korean Patent Office. Korean Patent Appiication No. 10-2013-7009678 Office Action dated May 26, 2014, pp. 1-12.

Cree, Inc., German Application No. 112011103148.3, Office Action, Oct. 30, 2014.

Cree, Inc., German Application No. 112011103147.5, Office Action, Oct. 31, 2014.

Cree, Inc., Taiwanese Application No. 100133831, Office Action, Nov. 19, 2014.

* cited by examiner

HIGH DENSITY MULTI-CHIP LED DEVICES

CROSS-REFERENCE TO RELATED APPLICATIONS

This application claims priority from, commonly owned provisional patent application Ser. No. 61/384,623, filed Sep. 20, 2010, and from, commonly owned provisional patent application Ser. No. 61/390,963, filed Oct. 7, 2010, the entire disclosures of both of which are incorporated herein by reference. Much of what is disclosed in this application is also disclosed in the commonly owned application Ser. No. 13/017,407, entitled "Multi-Chip LED Devices," filed on even date herewith, which is incorporated herein by reference.

BACKGROUND

Light emitting diode (LED) lighting systems are becoming more prevalent as replacements for existing lighting systems. LEDs are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and contain no lead or mercury. In many applications, one or more LED chips (or dies) are mounted within an LED package or on an LED module, and such a device may make up part of a lighting unit, lamp, "light bulb" or more simply a "bulb," which includes one or more power supplies to power the LEDs. An LED bulb may be made with a form factor that allows it to replace a standard threaded incandescent bulb, or any of various types of fluorescent lamps.

Care must be taken in the design of multi-chip LED devices. LEDs of different sizes have different current densities for the same drive current. As chips heat up, forward voltage drops, which, when chips are arranged in parallel will cause a chip to draw more current relative to its neighbors until current draw increases current density to a degree that forward voltage increases. The forward voltage distribution in some LED chips can hurt a multi-chip parallel arrangement as current draw will not be balanced, which can unbalance the optimal current/chip efficiency for a multi-chip device. It should be noted that large chips have a lower forward voltage for the same drive current than smaller chips due to current density.

SUMMARY

Embodiments of the present invention provide high-density, multi-chip LED devices with relatively high efficiency and light output in a relatively compact package. In some embodiments, an LED device includes a plurality of interconnected LED chips and an optical element disposed to affect light from the LED chips. In some embodiments, the optical element is less than 12 mm in diameter while maintaining a clearance between any of the LED chips and an edge of the optical element such that the clearance is approximately 0.2 to 0.8 the width of the plurality of LED chips. In some embodiments, the optical element is less than 10 mm in diameter. In some embodiments, the clearance is approximately 0.3 to 0.65 the width of the plurality of LED chips. In some embodiments, all of the LED chips or at least all the LED chips in a group of LED chips are connected in parallel. In other embodiments, the plurality of interconnected LED chips includes at least two groups of LED chips wherein the LED chips within each group are connected in parallel and the groups are connected in series.

Embodiments of the present invention obtain high light output and/or efficacy (efficiency in terms of lumens/Watt) from a relatively small footprint to enable lighting applications of LEDs for small fixtures such as halogen MR16 bulbs. The design of embodiments of the invention enable LED chips to be placed close together using top emitter or sideview chips with low reabsorption, especially for blue light. The design of the submount of the LED devices of the present invention also allows for chip interconnects, such as wire bonds, to be placed on the outside of groups of chips to minimize light absorption by the wires. Lens size is optimized, and the submount design minimizes light absorption by the submount itself as well.

In some embodiments, the optical element, which may be a lens, is about 9.1 mm in diameter. In some embodiments, the optical element is a molded silicone lens and the LED device, when the LED chips are energized, emits light with an efficiency of at least 80 lm/W and a color rendering index of at least 80. In some embodiments, the LED device emits light with an efficiency of at least about 95 lm/W and a CRI of at least 82, or an efficiency of at least 100 lm/W or 150 lm/W.

In some embodiments, the LED device includes a submount, and the LED chips are fixed to the submount. A plurality of wire bonds are connected to the LED chips, wherein each wire bond is connected between an LED chip and the submount and the plurality of wire bonds is arranged so that all the wire bonds are disposed on the outside of a group of LED chips. In some embodiments, the submount is a ceramic submount. In some embodiments, the submount is made of alumina. In some embodiments, the submount is made of aluminum nitride. In some embodiments, the submount includes semicircular areas of metal to which the LED chips are bonded. In some embodiments, the submount includes a connection bus, and at least some of the wire bonds used in the LED device are connected to the connection bus of the submount. In some embodiments, the bus is a central bus. The LED device in some embodiments can then be made by fixing the LED chips to the submount, connecting the plurality of wire bonds so that all wire bonds are disposed on the outside of a group of LED chips, and attaching an optical element such as a lens.

In some embodiments, a group of LED chips includes LED chips approximately equal in size. In some embodiments, a group includes LED chips of at least two different sizes. In some embodiments, different types of chips, such as vertical and sideview types are can be used. In some embodiments, different shapes of LED chips can be included as well. In some embodiments, each group includes six LED chips. In some embodiments, a group includes seven LED chips or eight LED chips. In some embodiments with LED chips of two different sizes, each of the larger LED chips are about 1000 microns in size and at least one group of LED chips further comprises at least one LED chip of about 700 microns or less in size.

DETAILED DESCRIPTION

Figure 1:
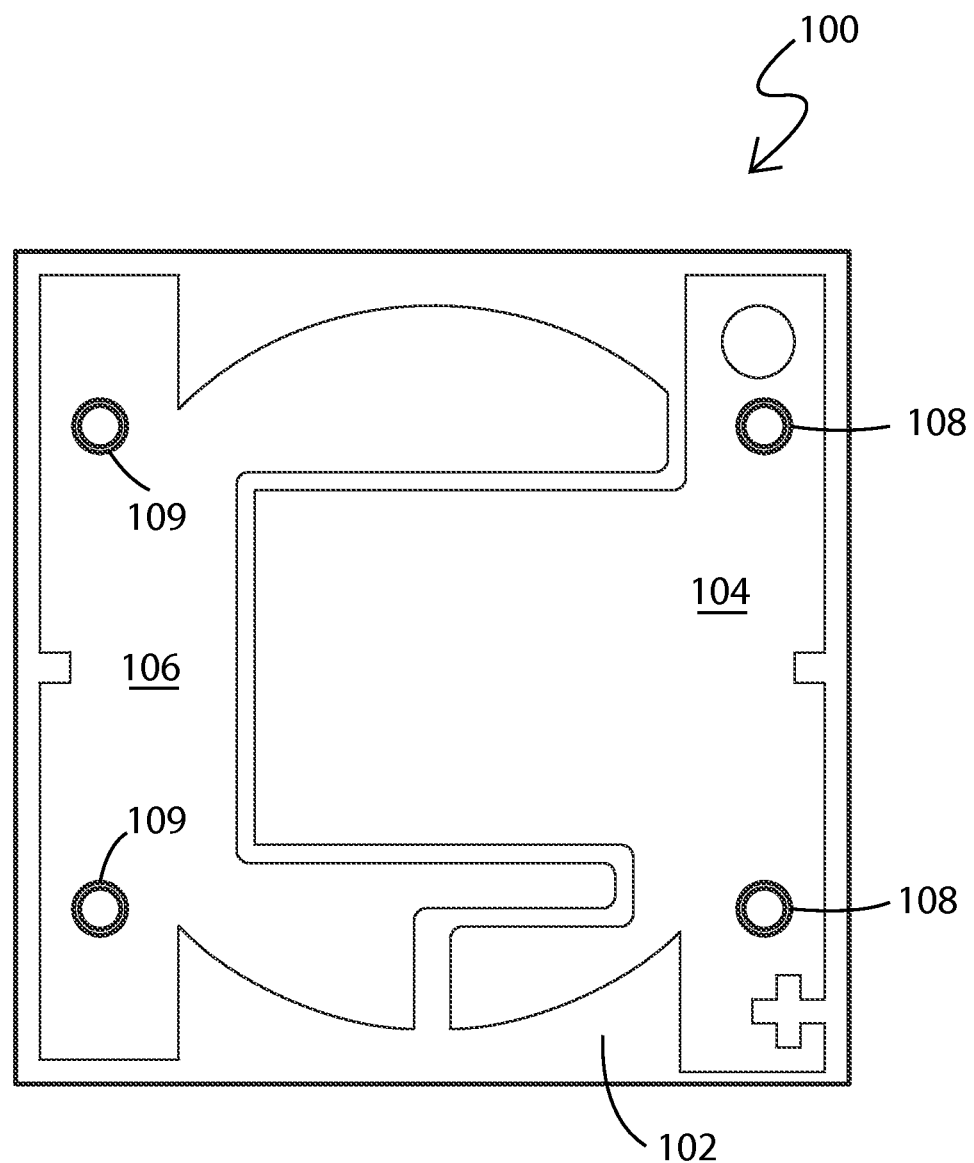
FIG. 1 is a top-down view of an LED submount according to example embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

FIG. 1 is a top-down view of a submount 100 for an LED device according to example embodiments of the invention. Submount 100 of FIG. 1 includes a rigid base 102 that, as an example, can be made of a ceramic material such as alumina or aluminum nitride. Submount 100 also includes a patterned metal layer shaped to provide connectivity to LED chips fixed to the submount. Metal layer portion 104 is for connection to the anodes of the LED chips fixed to the submount, and metal layer portion 106 is for connection to the cathodes of said LED chips. The metal layer can be initially deposited on the ceramic base and then etched to form the desired pattern, can be formed and fixed to the base with adhesive, or produced in any other suitable fashion. The metal layer can include various holes and notches for alignment during manufacturing, visible identification and the like, such as connection points 108 for connecting wires from the positive side of the power source to the LED device and connection points 109 for connecting wires from the negative side of the power source to the LED device. Connection points may be formed of additional metal or solder deposited on the metal layer.

Figure 2:
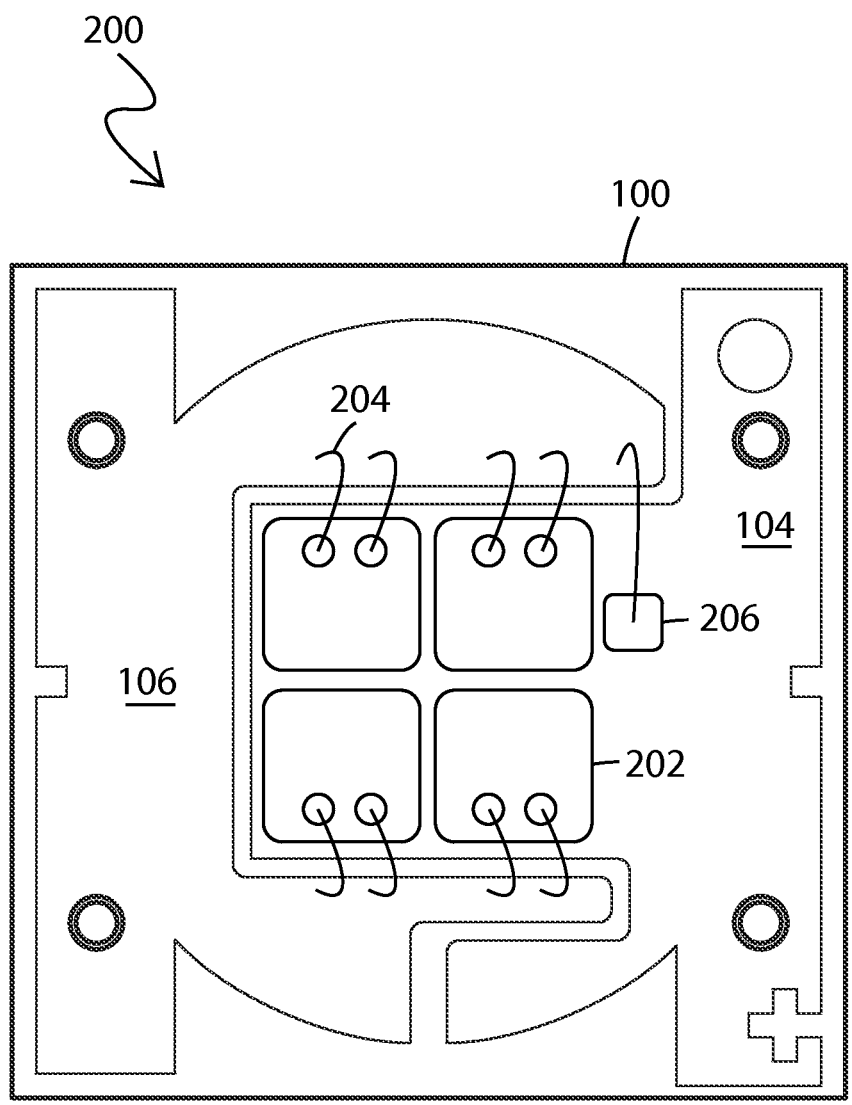
FIG. 2 is a top-down view of a multi-chip LED device according to an embodiment of the invention. In this case, each LED is connected via the bottom mounting surface of the chip and a wire bond on top of the chip. The device of FIG. 2 makes use of the submount of FIG. 1 and the lens and its distortion are omitted for clarity.

FIG. 2 is a top-down view of an LED device 200 according to example embodiments of the invention. LED device 200 makes use of submount 100 as described in FIG. 1. LED device 200 includes a plurality of interconnected LED chips 202 fastened to metal layer portion 104 of the submount. In this particular example, four LED chips are used. The anodes of the LED chips are on the bottom of the chips in this view and are in contact with metal layer portion 104, which is in turn connected to the positive terminal of a power source supplying current to the LED chips. The cathodes of the LED chips are connected by wire bonds 204 to metal layer portion 106, which is in turn connected to the negative terminal of the power source. Thus, in this example embodiment, the four LED chips are connected in parallel.

Staying with FIG. 2, LED device 200 includes an electrostatic discharge (ESD) protection chip 206, also fastened to metal layer portion 104. ESD chip 206 is connected with a wire bond to metal layer portion 106. It should also be noted that the wire bonds 204 connected between an LED chips and the submount are arranged so that all the wire bonds are disposed on the outside of the group of four LED chips used in LED device 200. This arrangement allows the plurality of LED chips to be placed close together and be relatively small but still have relatively high efficiency and output. Additionally, four chips can be combined in various color combinations to achieve a desired CRI, color temperature, or other color-related characteristic.

LED chips 202 and ESD chip 206 of FIG. 2 can be fastened to the submount with conductive adhesive, solder, a welding process, or in any of various other ways. The device is completed with an optical element, for example a lens, placed on top of the device and fastened in place to affect light from the LED chips. Both the lens and the distortion it would introduce when the device is viewed are omitted from FIG. 2 for clarity of illustration, but an example lens is illustrated later in connection with another embodiment of the invention. Both the term "optical element" and the term "lens" as used in this disclosure are intended in their broadest sense. Such an element may affect light by bending and/or concentrating light rays, by color mixing, or by a combination of these effects. A phosphor could also be used to provide wavelength conversion. A lens for use with an LED device of an embodiment of the invention may be made of glass or plastic, may be molded in place or elsewhere, or otherwise formed or attached to the device as desired. For example, the lens may be molded in place from silicone. In example embodiments, a clearance is maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example with four LED chips, if the maximum width of the LED chips is 1.4 mm, the lens clearance is about 0.9 mm, or about 0.643 the maximum width of the LED chips.

LED chips 202 of FIG. 2 may be selected from various light color bins to provide a combined light output with a high color rendering index (CRI). The desired color mixing may be achieved, for example, using blue, green, amber, red and/or red-orange LED chips. One or more of the chips may be in a package with a phosphor or may otherwise have a locally applied phosphor. An example of selecting chips from various color bins to produce desired color characteristics is described in U.S. Patent Application 2010/0140633, published Jan. 10, 2010, which is incorporated herein by reference. A detailed example of using groups of LEDs emitting light of different wavelengths to produce substantially white light can be found in issued U.S. Pat. No. 7,213,940, which is incorporated herein by reference.

In some example embodiments, the lens for an LED device such as LED device 200 of FIG. 2 may be less than 5 mm in diameter or less than 4 mm in diameter. In some embodiments the lens may be about 3.1 mm in diameter and may include LED chips of about 700 microns in size, meaning the chips are about 700 microns wide on a side. The chips may be about or less than 1000 microns in size, about or less than 700 microns in size, about or less than 500 microns in size, or about or less than 300 microns in size. An LED device like that shown in FIG. 2 may have an efficiency of at least 80 lumens/Watt (lm/W) and a CRI of at least 80. The LED device may have an efficiency of at least 89 lm/W and a CRI of at least 82. The design of the LED device can be adapted so that various types of LED chips could be used, such as direct-bond chips, flip-chips, and chips with substrates made of sapphire, silicon carbide, silicon or other materials.

Figure 3:
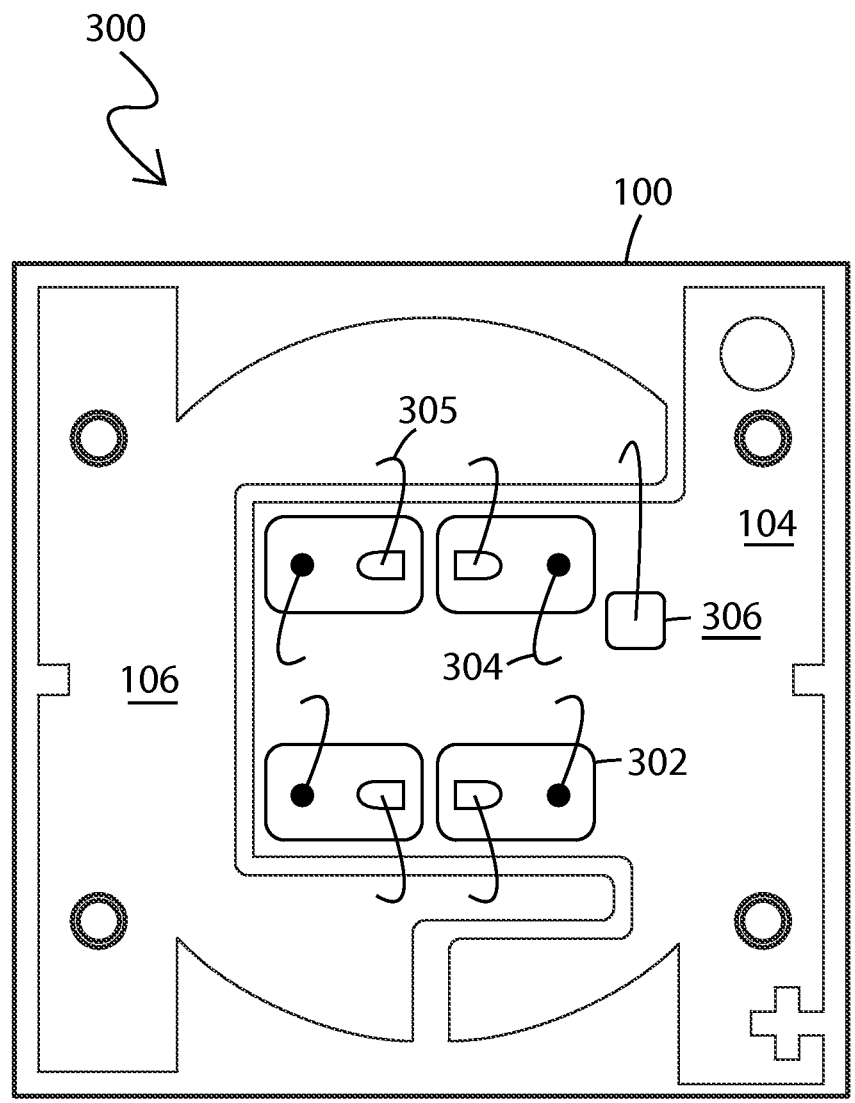
FIG. 3 is a top-down view of a multi-chip LED device according to another embodiment of the invention. In this case, the chips are sideview chips with two wire bonds on top of each LED chip are used to connect the chip. The device of FIG. 3 again makes use of the submount of FIG. 1 and the lens and its distortion are omitted for clarity.

FIG. 3 is a top-down view of an LED device 300 according to some example embodiments of the invention. LED device 300 again makes use of submount 100 as described in FIG. 1. LED device 300 includes a plurality of interconnected LED chips 302 fastened to metal layer portion 104 of the submount. In this example, the LED chips are so-called "sideview" LEDs, for each of which the connection points for both the anode and cathode are on top. The anodes of the LED chips are connected to metal layer portion 104 with wire bonds 304, and the cathodes of the LED chips are connected by wire bonds 305 to metal layer portion 106. In this example embodiment, the four LED chips are again connected in parallel.

Staying with FIG. 3, LED device 300 includes an electrostatic discharge (ESD) protection chip 306, fastened to metal layer portion 104. ESD chip 306 is also connected with a wire bond to metal layer portion 106. It should also be noted that the wire bonds connected between the plurality of LED chips and the submount are arranged so that all the wire bonds tend to the outside of the group of four LED chips used in LED device 300 as much as possible. This arrangement again allows the LED chips to be placed close together. As before, the LED chips can be combined in various color combinations to achieve a desired CRI, color temperature, or other color-related characteristic.

LED chips 302 of FIG. 3 can be fastened to the submount with adhesive, or in any of various other ways. Since these sideview chips have both connections on top, the adhesive need not be conductive. As before, the device is completed with an optical element, for example a lens, placed on top of the device and fastened in place to affect light from the LED chips. Both the lens and the distortion it would introduce when the device is viewed are omitted from FIG. 3 for clarity of illustration, but an example lens is illustrated later in connection with another embodiment of the invention. Both the term "optical element" and the term "lens" as used in this disclosure are intended in their broadest sense. Such an element may affect light by bending and/or concentrating light rays, by color mixing, or by a combination of these effects. A phosphor could also be used to provide wavelength conversion. A lens for use with an LED device of an embodiment of the invention may be made of glass or plastic, may be molded in place or elsewhere, or otherwise formed or attached to the device as desired. For example, the lens may be molded in place from silicone. In example embodiments, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. LED chips 302 of FIG. 3 may again be selected from various light color bins to provide a combined light output with a high color rendering index (CRI). The desired color mixing may be achieved, for example, using blue, green, amber, red and/or red-orange LED chips. One or more of the chips may be in a package with a phosphor or may otherwise have a locally applied phosphor.

In some example embodiments, the lens for an LED device such as LED device 300 of FIG. 3 may be less than 5 mm in diameter or less than 4 mm in diameter. In some embodiments the lens may be about 3.1 mm in diameter. LED chips of various sizes and shapes may be used. A typical sideview chips has a rectangular top, angled sides, and a smaller, rectangular bottom. The sides of the rectangle can vary between about 100 and 500 microns, and the chip may have a thickness of 100 to 150 microns.

Figure 4:
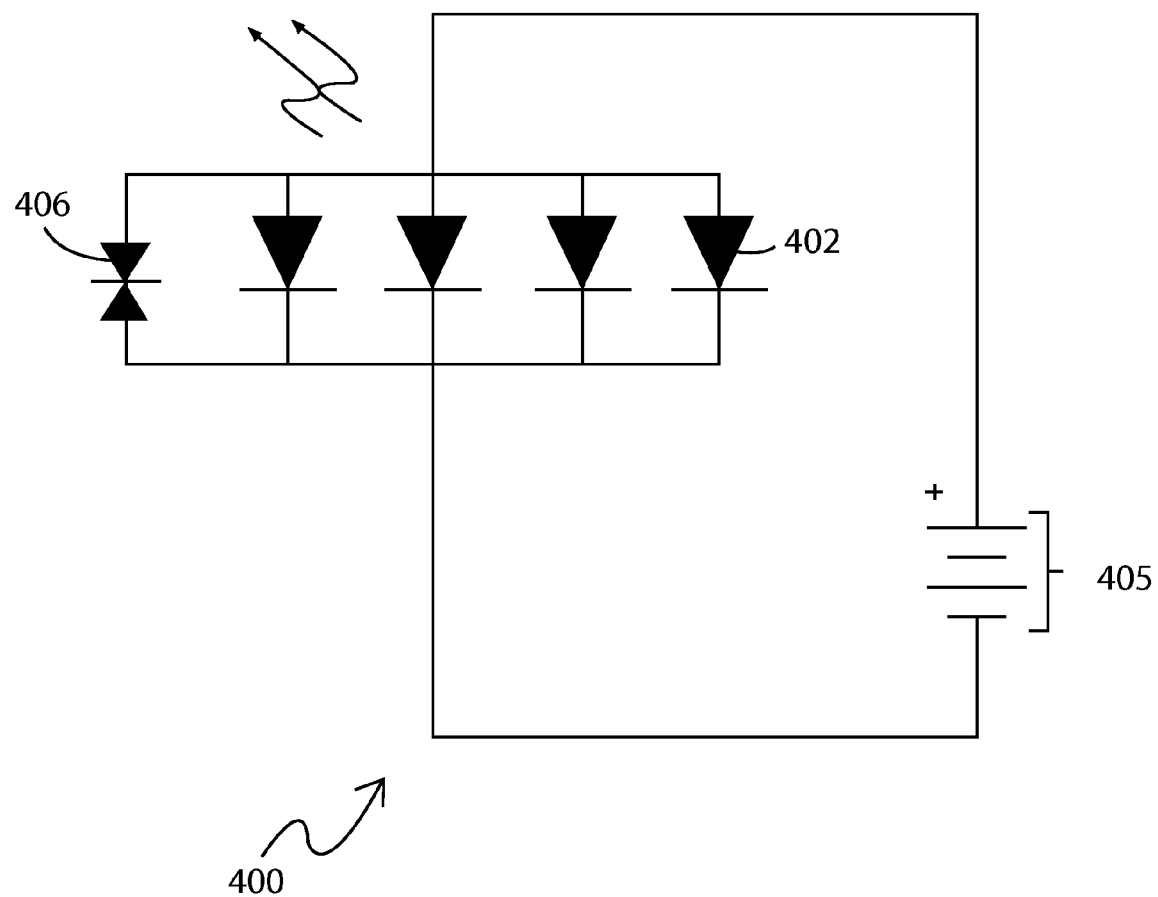
FIG. 4 is an electrical schematic diagram of the LED devices of FIGS. 2 and 3.

FIG. 4 is an electronic schematic diagram of the circuit of the LED devices from FIGS. 2 and 3. Circuit 400 includes four LEDs 402 connected in parallel to form a single group of LEDs. Current to illuminate the LEDs is supplied by power source 405. ESD protection device 406 is connected in parallel with the LEDs.

Figure 5:
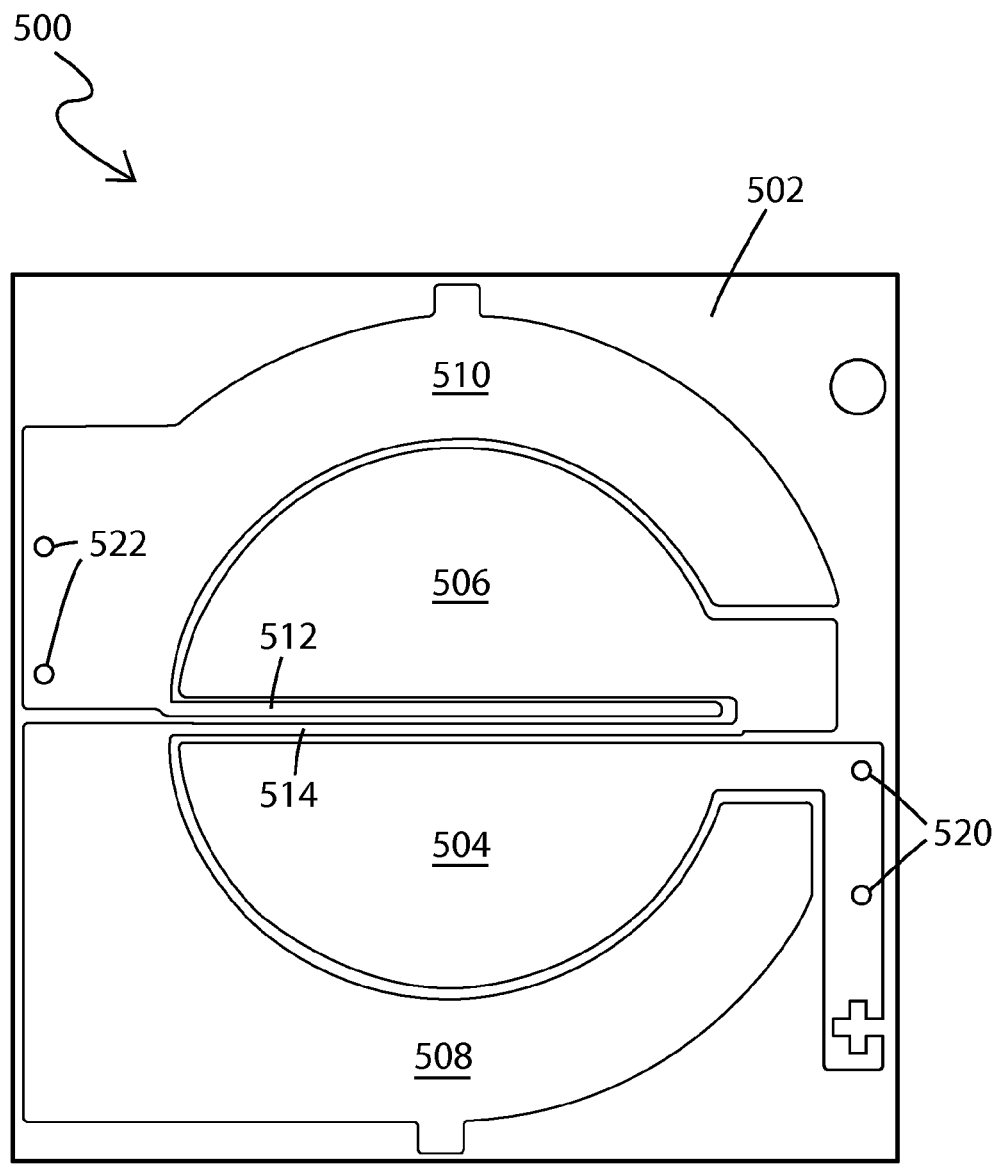
FIG. 5 is a top-down view of an LED submount according to other example embodiments of the present invention.

FIG. 5 is a top-down view of a submount 500, which can be used for various LED devices according to example embodiments of the invention. Submount 500 of FIG. 5 includes a rigid base 502 that, as an example, can be made of plastic, or as a further example can be made of a ceramic material such as alumina or aluminum nitride. Submount 500 includes a patterned metal layer shaped to provide connectivity to LED chips fixed to the submount. This patterned metal layer includes semicircular areas of metal to which LED chips can be bonded. Metal layer portion 504 is for connection to the anodes of one group of LED chips fixed to the submount, and metal layer portion 506 is for connection to the anodes of another group of LED chips. Metal layer portion 508 is for connection to some of the cathodes of LED chips in the first group of LED chips, and metal layer portion 510 is for connection to some of the cathodes in the other group of LED chips. Metal layer portion 510 is connected to protruding rail 512 and metal layer portions 506 and 508 are connected by interconnection rail 514. Rails 512 and 514 run near each other and form a centrally located connection bus, or more simply, a central bus to which wire bonds from some of the cathodes of the LED chips are connected. A central bus or central connection bus within the meaning of this disclosure is a part of the metal layer of a submount where portions to be connected to different LEDs or different terminals of the LEDs come close together to allow connections that enable relatively high chip-density. Such a central bus typically has one or more connection rails providing at least some of the connection portions. In this example, wire bonds from some of the cathodes of LED chips from the first group of LED chips are connected to rail 514 and wire bonds from some of the cathodes of LED chips in the additional group of LED chips are connected to rail 512.

The metal layer can be initially deposited on the base and then etched to form the desired pattern, can be formed and fixed to the base with adhesive, molded into a base, or produced in any other suitable fashion. The metal layer can include various holes and notches for alignment during manufacturing, visible identifications and the like, as well as connection points, such as connection points 520 for connecting wires from the positive side of the power source to the LED device and connection points 522 for connecting wires from the negative side of the power source to the LED device. Connection points may be formed of additional metal or solder deposited on the metal layer.

Figure 6:
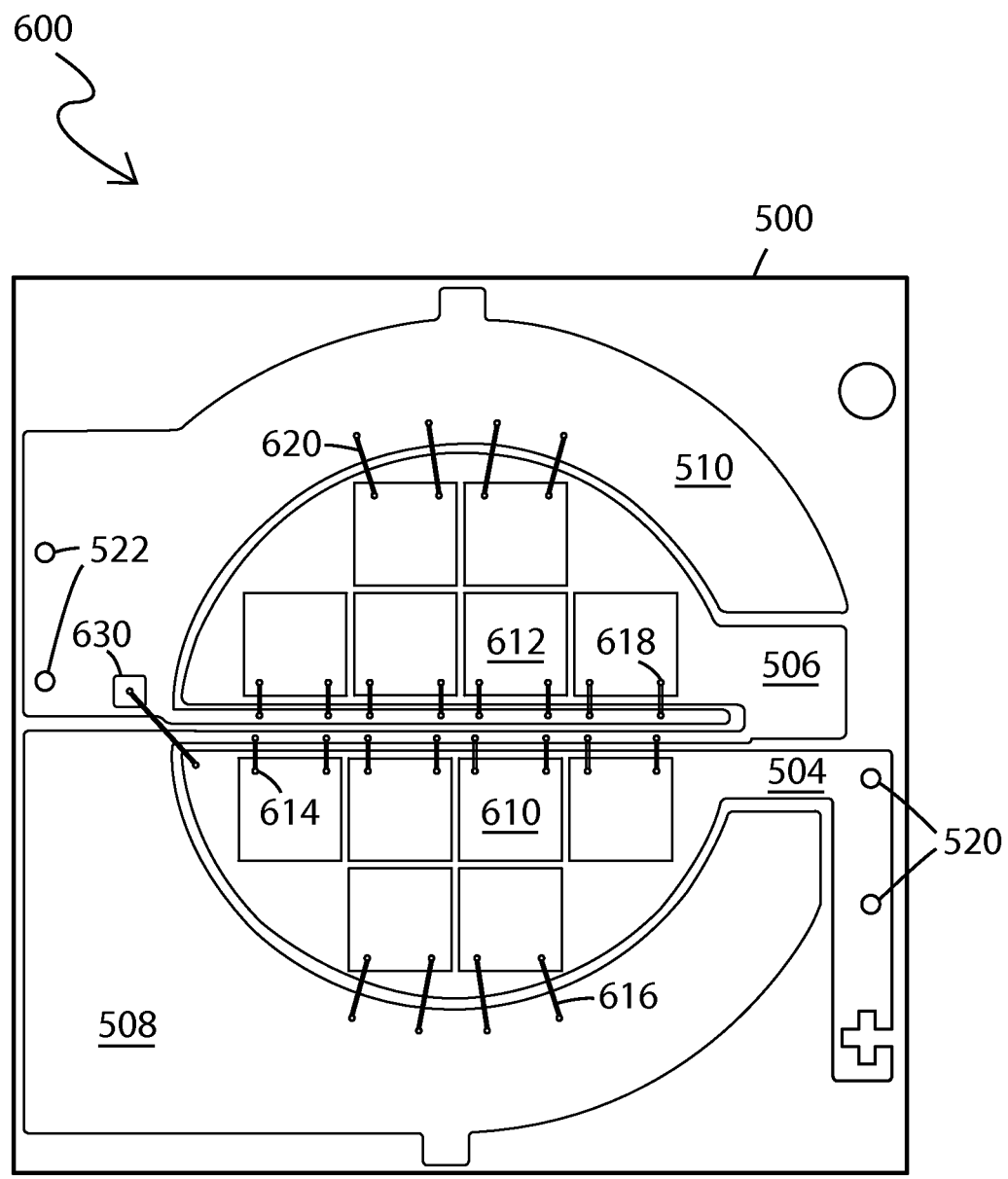
FIGS. 6-9 are top-down views of various high density, multi-chip LED devices according to example embodiments of the invention. The embodiments shown in FIGS. 6-9 all make use of the submount of FIG. 5 and the lens and its distortion are omitted for clarity.

FIG. 6 is a top-down view of an LED device 600 according to some example embodiments of the invention. LED device 600 makes use of submount 500 as described in FIG. 5. LED device 600 includes twelve LED chips arranged in two groups. Six LED chips 610 are fastened to metal layer portion 504 of the submount and are connected in parallel. The anodes are on the bottom of the LED chips 610 and are in contact with metal layer portion 504, which is in turn connected to the positive terminal of a power source supplying current to the device via connection points 520. Six LED chips 612 are fastened to metal layer portion 506 of the submount and are also connected in parallel. The anodes of the LED chips 612 are in contact with metal layer portion 506.

Still referring to FIG. 6, the cathodes of all of the LED chips are connected by wire bonds to metal layer portions of submount 500 as follows. Wire bonds from the cathodes of LED chips 610 are connected to metal layer portions of the submount. More specifically, wire bonds 614 are connected to interconnection rail 514 of the central bus of submount 500, and wire bonds 616 are connected to metal layer portion 508 of the submount. Wire bonds from the cathodes of LED chips 612 are also connected to metal layer portions of the submount. More specifically, wire bonds 618 are connected to extension rail 512 of the central bus of submount 500, and wire bonds 620 are connected to metal layer portion 510 of the submount 500.

Staying with FIG. 6, LED device 600 includes an electrostatic discharge (ESD) protection chip 630, fastened to metal layer portion 510 and connected with a wire bond to metal layer portion 504. Metal layer portion 504 is connected to the positive terminal of a power source supplying current to the LED device. Metal layer portion 510 is connected to the negative terminal of a power source supplying current to the LED device. The wire bonds connected between the LED chips within each group of six LED chips in LED device 600 and the submount are arranged so that all the wire bonds in a group are disposed on the outside of the group of six LED chips, allowing the LED chips in a group to be placed close together and this density of the LED chips in a group allows LED device 600 to be relatively small but still have a relatively high efficiency and output. Also, the patterning of the metal layer portions of the submount together with the arrangement of wire bonds interconnects the LED chips within a group in parallel while the groups themselves are connected in series.

The LED chips and ESD chip of LED device 600 of FIG. 6 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 6 for clarity of illustration, but an example lens is discussed later with respect to FIG. 14. Again, an optical element, for example, a lens, may affect light by bending and/or concentrating light rays, by color mixing, or by a combination of these effects. A phosphor could also be used to provide wavelength conversion. A lens or other optical element for use with an LED device of embodiments of the invention may be made of glass or plastic, may be molded in place or elsewhere, or otherwise formed or attached to the device as desired. In example embodiments, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example, if the maximum width of the LED chips is 5.6 mm, the lens clearance is about 1.7 mm, or about 0.303 the maximum width of the LED chips.

As before, the LED chips in the device of FIG. 6 may be selected from various light color bins to provide a combined light output with a high CRI. In some example embodiments, the lens for an LED device such as LED device 600 of FIG. 6 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, chips of various sizes may be used. The chips may be about or less than 2000 microns in size, about or less than 1000 microns in size, about or less than 700 microns in size or about or less than 500 microns in size. Also, mixed chip sizes may be used in a single device. A specific example embodiment with mixed chip sizes is described later in this disclosure with respect to FIG. 9. An LED device like that shown in FIG. 6 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved. The design of the LED device of FIG. 6 can be adapted so that various types of LED chips could be used, such as direct-bond chips, flip-chips, and chips with substrates made of sapphire, silicon carbide, silicon or other materials.

Figure 7:
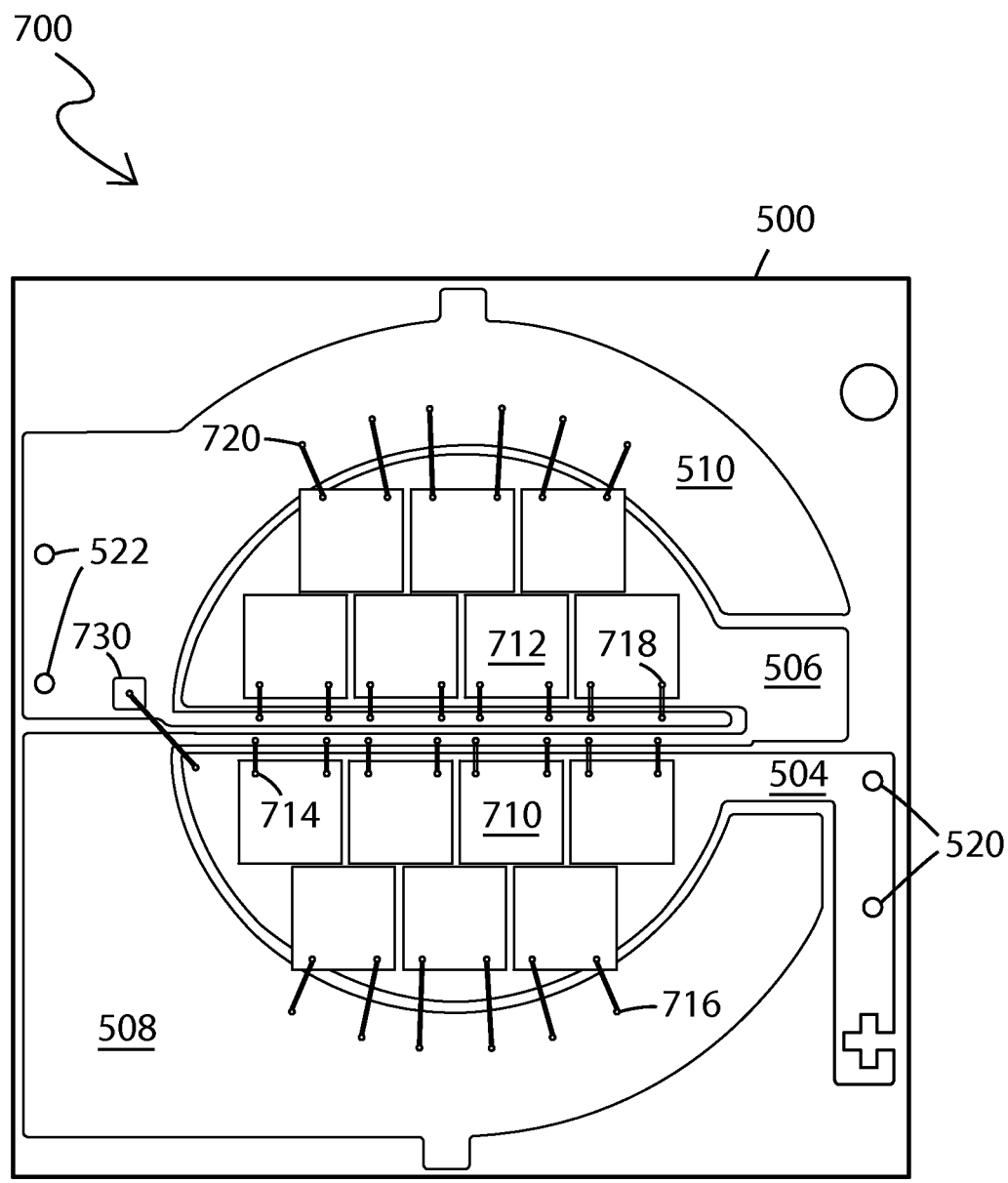
Figure 8:
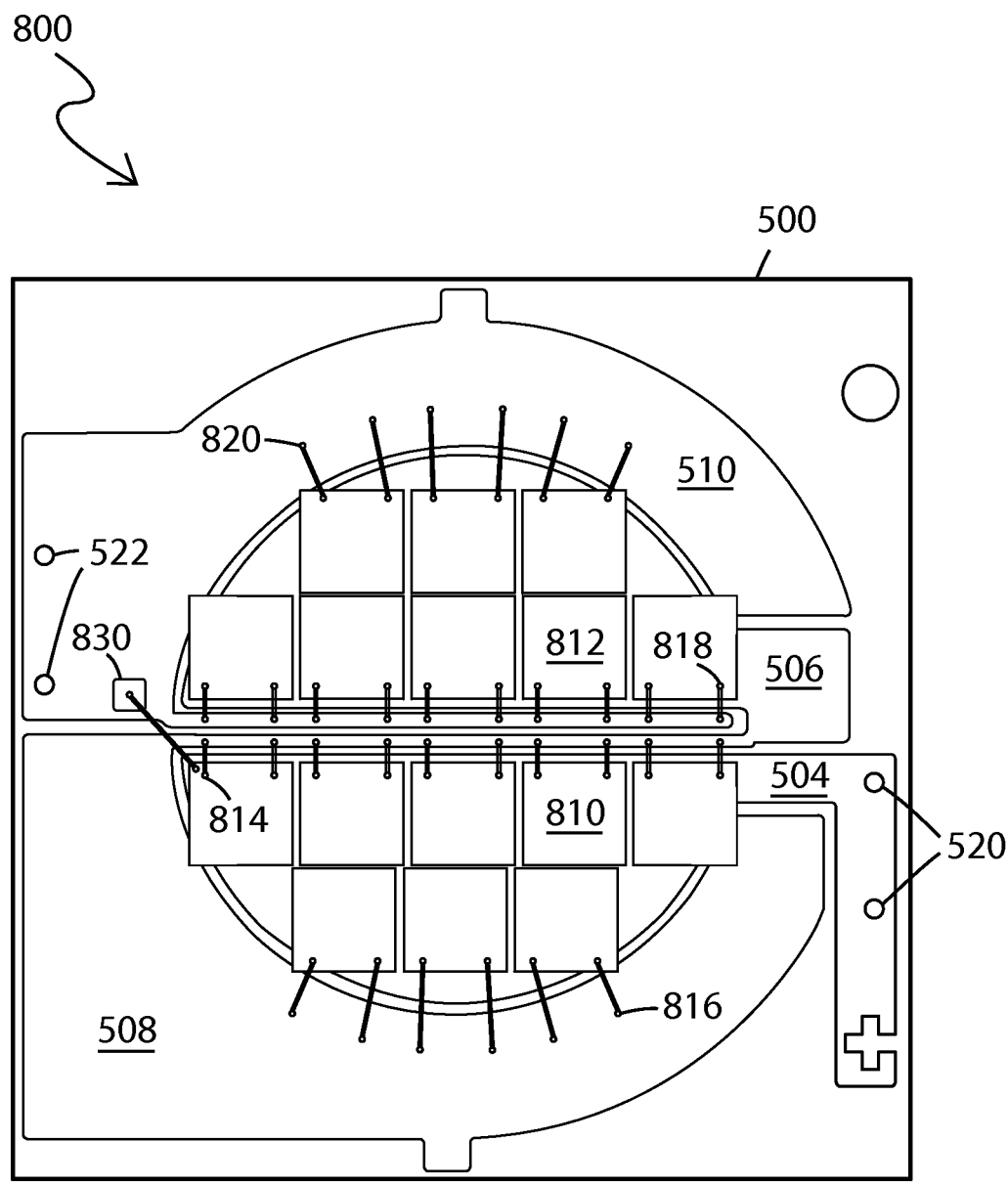

FIGS. 7 and 8 are top-down views of LED devices that are similar to the device shown in FIG. 6, but which include more LED chips in each group. FIG. 7 is a top-down view of an LED device 700 according to some example embodiments of the invention. LED device 700 makes use of submount 500 as previously described. LED device 700 includes fourteen LED chips arranged in two groups. Seven LED chips 710 are fastened to metal layer portion 504 of the submount and are connected in parallel. Seven LED chips 712 are fastened to metal layer portion 506 of the submount and are also connected in parallel. As before, the anodes of the LED chips are in contact with portions of the metal layer of submount 500.

Still referring to FIG. 7, the cathodes of all of the LED chips are connected by wire bonds to metal layer portions of submount. Wire bonds 714 are connected to interconnection rail 514 of the central bus of submount 500, and wire bonds 716 are connected to metal layer portion 408 of the submount. Wire bonds 718 are connected to extension rail 512 of the central bus of submount 500, and wire bonds 720 are connected to metal layer portion 510 of the submount 500. LED device 700 includes an electrostatic discharge (ESD) protection chip 730, fastened to metal layer portion 510 with a wire bond connected to metal layer portion 504. As before, metal layer portion 504 is connected to the positive terminal of a power source and metal layer portion 510 is connected to the negative terminal. The wire bonds connected between the LED chips within each group of seven LED chips in LED device 700 and the submount are again arranged so that all the wire bonds in a group are disposed on the outside of the group of seven LED chips, allowing the LED chips in a group to be placed close together. The LED chips within a group are connected in parallel while the groups of chips are connected in series.

The LED chips and ESD chip of LED device 700 of FIG. 7 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 7 for clarity of illustration. Again, an optical element, for example, a lens, may affect light by bending and/or concentrating light rays, by color mixing, or by a combination of these effects. A phosphor could also be used to provide wavelength conversion. A lens or other optical element for use with an LED device of any embodiment of the invention may be made of glass or plastic, may be molded in place or elsewhere, or otherwise formed or attached to the device as desired. In example embodiments, clearance is maintained between the edge of any of the plurality of interconnected LED chips and the edge of the lens as previously described.

As before, the LED chips in the device of FIG. 7 may be selected from various light color bins to provide a combined light output with a high CRI. In some example embodiments, the lens for an LED device such as LED device 700 of FIG. 7 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, of various sizes, materials, and types may be used, as described with respect to FIG. 6. An LED device like that shown in FIG. 7 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved.

FIG. 8 is a top-down view of an LED device 800 according to some example embodiments of the invention. LED device 800 makes use of submount 500 as previously described, and includes sixteen LED chips arranged in two groups. Eight LED chips 810 are fastened to metal layer portion 504 of the submount. Eight LED chips 812 are fastened to metal layer portion 506 of the submount. As before, the anodes of the LED chips are in contact with portions of the metal layer of submount 500. The cathodes of all of the LED chips in device 800 are connected by wire bonds to metal layer portions of the submount. Wire bonds 814 are connected to interconnection rail 514 of the central bus of submount 500, and wire bonds 816 are connected to metal layer portion 408 of the submount. Wire bonds 818 are connected to extension rail 512 of the central bus of submount 500, and wire bonds 820 are connected to metal layer portion 510 of the submount 500.

Still referring to FIG. 8, device 800 includes an electrostatic discharge (ESD) protection chip 830, fastened to metal layer portion 510 and connected by a wire bond to metal layer portion 504. As before, metal layer portion 504 is connected to the positive terminal of a power source and metal layer portion 510 is connected to the negative terminal. The wire bonds connected between the LED chips within each group of eight LED chips in LED device 800 and the submount are again arranged so that all the wire bonds in a group are disposed on the outside of the group of eight LED chips, allowing the LED chips in a group to be placed close together. The LED chips within a group are connected in parallel while the groups are connected in series.

The LED chips and ESD chip of LED device 800 of FIG. 8 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 8 for clarity of illustration. Again, an optical element, for example, a lens, may affect light by bending and/or concentrating light rays, by color mixing, or by a combination of these effects. A phosphor could also be used to provide wavelength conversion. A lens or other optical element for use with an LED device of any embodiment of the invention may be made of glass or plastic, may be molded in place or elsewhere, or otherwise formed or attached to the device as desired. Clearance is maintained between the edge of any of the plurality of interconnected LED chips and the edge of the lens as previously described.

As before, the LED chips in the device of FIG. 8 may be selected from various light color bins to provide a combined light output with a high CRI. In some example embodiments, the lens for an LED device such as LED device 800 of FIG. 8 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, of various sizes, materials, and types may be used, as described with respect to FIG. 6. An LED device like that shown in FIG. 8 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved.

As previously mentioned, an embodiment of the invention does not need to use

Figure 9:
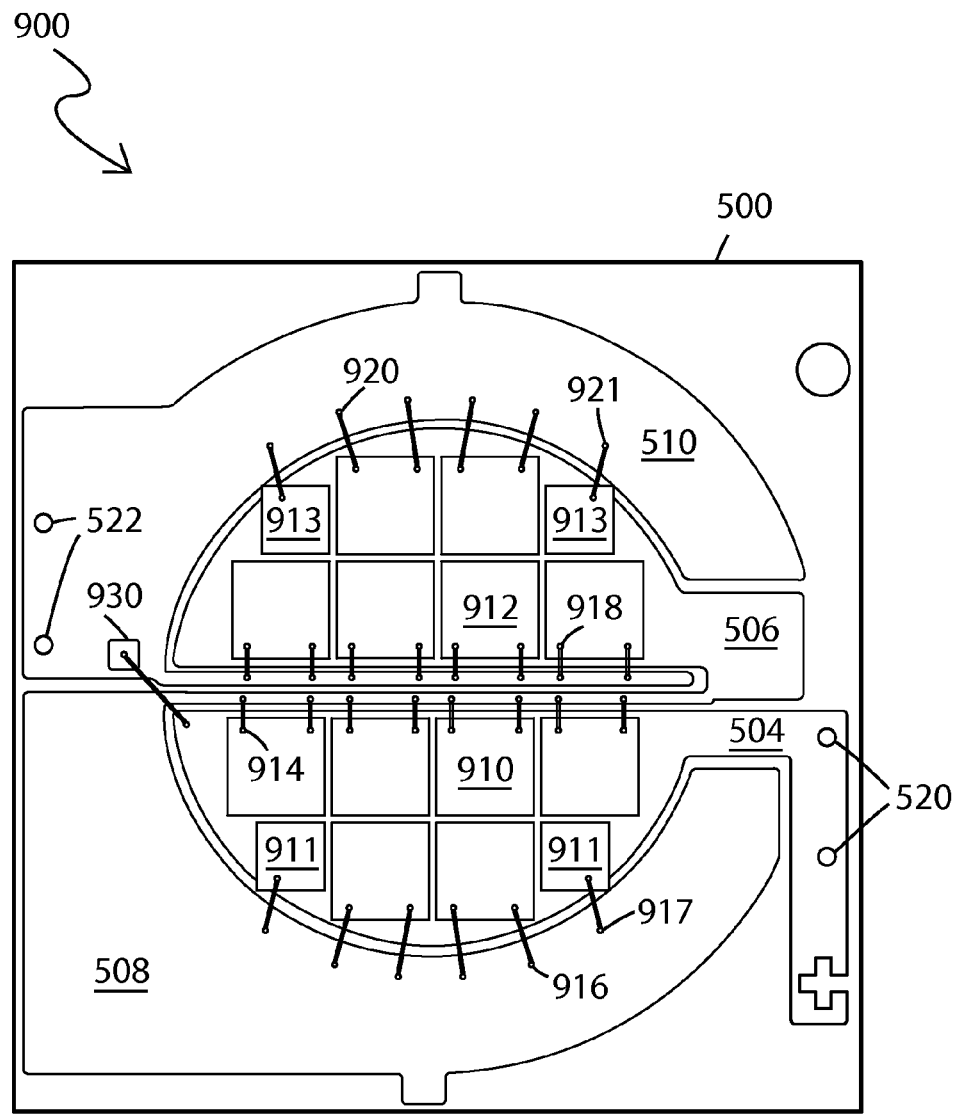

LED chips of equal size. FIG. 9 is a top-down view of an LED device 900 in which different sizes of LED chips are used. LED device 900 makes use of submount 500 as described in FIG. 4. LED device 900 includes sixteen LED chips, including chips of two different sizes, arranged in two groups. Six LED chips 910 of one size and two LED chips 911 of a smaller size are fastened to metal layer portion 504 of the submount and are connected in parallel. The anodes of the LED chips 910 and 911 are on the bottoms of the chips and are in contact with metal layer portion 504, which is in turn connected to the positive terminal of a power source supplying current to the device via connection points 520. Six LED chips 912 of one size and two LED chips 913 of a smaller size are fastened to metal layer portion 506 of the submount and are also connected in parallel. The anodes of the LED chips 912 and 913 are on the bottoms of the chips and are in contact with metal layer portion 506.

Still referring to FIG. 9, the cathodes of all of the LED chips are connected by wire bonds to metal layer portions of submount 500 as follows. Wire bonds 914 are connected from the cathodes of some of LED chips 910 to interconnection rail 514 of the central bus of submount 500, and wire bonds 916 are connected from the rest of LED chips 910 to metal layer portion 508 of the submount. Wire bonds 917 are connected from the cathodes of smaller LED chips 911 to metal layer portion 408 of the submount. Wire bonds 918 from the cathodes of some of LED chips 912 are connected to extension rail 512 of the central bus of submount 500, and wire bonds 920 are connected from the cathodes of the remainder of LED chips 912 to metal layer portion 510 of the submount 500. Wire bonds 921 are connected from the cathodes of smaller LED chips 913 to metal layer portion 508 of the submount.

Staying with FIG. 9, LED device 900 includes an electrostatic discharge (ESD) protection chip 930 connected as previously described. Metal layer portion 504 is connected to the positive terminal of a power source supplying current to the LED device. Metal layer portion 510 is connected to the negative terminal of a power source supplying current to the LED device. The wire bonds connected between the LED chips within each group of eight, mixed size LED chips in LED device 900 and the submount are arranged so that all the wire bonds in a group are disposed on the outside of the group of LED chips, allowing the LED chips in a group to be placed close together. Also, the patterning of the metal layer portions of the submount together with the arrangement of wire bonds interconnects the LED chips within a group in parallel while the groups of chips are connected in series.

As with the other embodiments, the LED chips and ESD chip of LED device 900 of FIG. 9 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 9 for clarity of illustration. Again, an optical element, for example, a lens, may affect light by bending and/or concentrating light rays, by color mixing, or by a combination of these effects. A phosphor could also be used to provide wavelength conversion. A lens or other optical element for use with an LED device of any embodiment of the invention may be made of glass or plastic, may be molded in place or elsewhere, or otherwise formed or attached to the device as desired. In example embodiments, an appropriate clearance is again maintained between the edge of any of the plurality of interconnected LED chips and the edge of the lens.

As before, the LED chips in the device of FIG. 9 may be selected from various light color bins to provide a combined light output with a high CRI. In some example embodiments, the lens for an LED device such as LED device 900 of FIG. 9 may be less than 12 mm in diameter. In some embodiments, the lens may be less than 10 mm in diameter, less than 9 mm in diameter, or less than 8 mm in diameter. In some embodiments the lens may be about 9.1 mm in diameter. Various numbers of chips of various sizes may be combined in different ways to form a device according to embodiments of the invention. Chips of two different size, three different sizes or four different sizes may be used. Larger LED chips of about 1000 microns in size, meaning the chips are about 1000 microns wide on a side, can be used. However, of various sizes may be used. The larger chips may be about or less than 2000 microns in size, about or less than 1000 microns in size, about or less than 700 microns in size or about or less than 500 microns in size. The smaller chips may be 1000 microns, 700 microns, 500 microns in size, or smaller.

The ability to use multiple LED chips of different sizes allows a designer to "tune" the multi-chip LED device for the desired combination of voltage, current density and light output. Smaller chips can also be used to fill in spaces between or around larger chips to achieve greater chip density. LED chips of different sizes have different current densities for the same drive current, as larger chips have a lower forward voltage for the same drive current than smaller chips due to current density. LED chips of different sizes can be mixed together in either embodiments of the invention using one group of chips, such as the embodiment described with respect to FIG. 2, or in embodiments with two groups of chips where parallel groups are connected in series, such as those described with respect to FIGS. 6-9. An LED device like that shown in FIG. 9 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved. The design of the LED device of FIG. 9 can again be adapted so that various types of LED chips could be used, such as direct-bond chips, flip-chips, and chips with substrates made of sapphire, silicon carbide, silicon or other materials.

Figure 10:
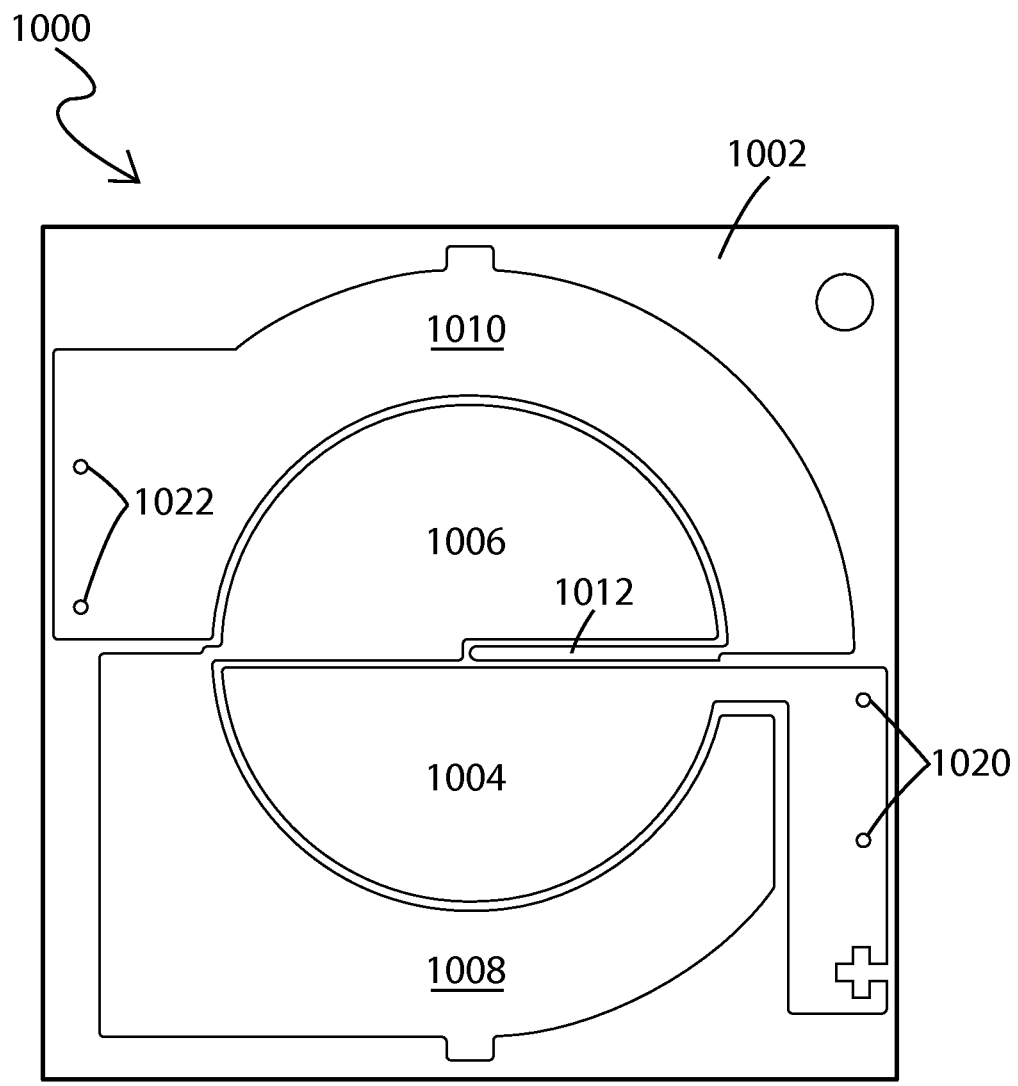
FIG. 10 is a top-down view of an LED submount according to further example embodiments of the present invention.

FIG. 10 is a top-down view of another submount 1000, which can be used for various LED devices according to example embodiments of the invention. Submount 1000 of FIG. 10 again includes a rigid base 1002 that, as an example, can be made of plastic, or as a further example can be made of a ceramic material such as alumina or aluminum nitride. Submount 1000 includes a patterned metal layer shaped to provide connectivity to LED chips fixed to the submount. This patterned metal layer again includes semicircular areas of metal to which vertical LED chips can be bonded. Metal layer portion 1004 is for connection to the anodes of one group of LED chips fixed to the submount, and metal layer portion 1006 is for connection to the anodes of another group of LED chips. Metal layer portion 1008 is for connection to some of the cathodes of LED chips in the first group of LED chips, and metal layer portion 1010 is for connection to some of the cathodes in the other group of LED chips. Metal layer portion 1010 is connected to protruding rail 1012 and metal layer portions 1004 and 1006 are both adjacent to this rail, and near each other. Like the submount shown in FIG. 5, rail 1012 and the adjacent portions of the metal layer form a centrally located connection bus, or more simply, a central bus to which wire bonds from some of the cathodes of the LED chips are connected.

The metal layer can be initially deposited on the base and then etched to form the desired pattern, can be formed and fixed to the base with adhesive, molded into a base, or produced in any other suitable fashion. The metal layer can include various holes and notches for alignment during manufacturing, visible identifications and the like, as well as connection points, such as connection points 1020 for connecting wires from the positive side of the power source to the LED device and connection points 1022 for connecting wires from the negative side of the power source to the LED device. Connection points may be formed of additional metal or solder deposited on the metal layer.

Figure 11:
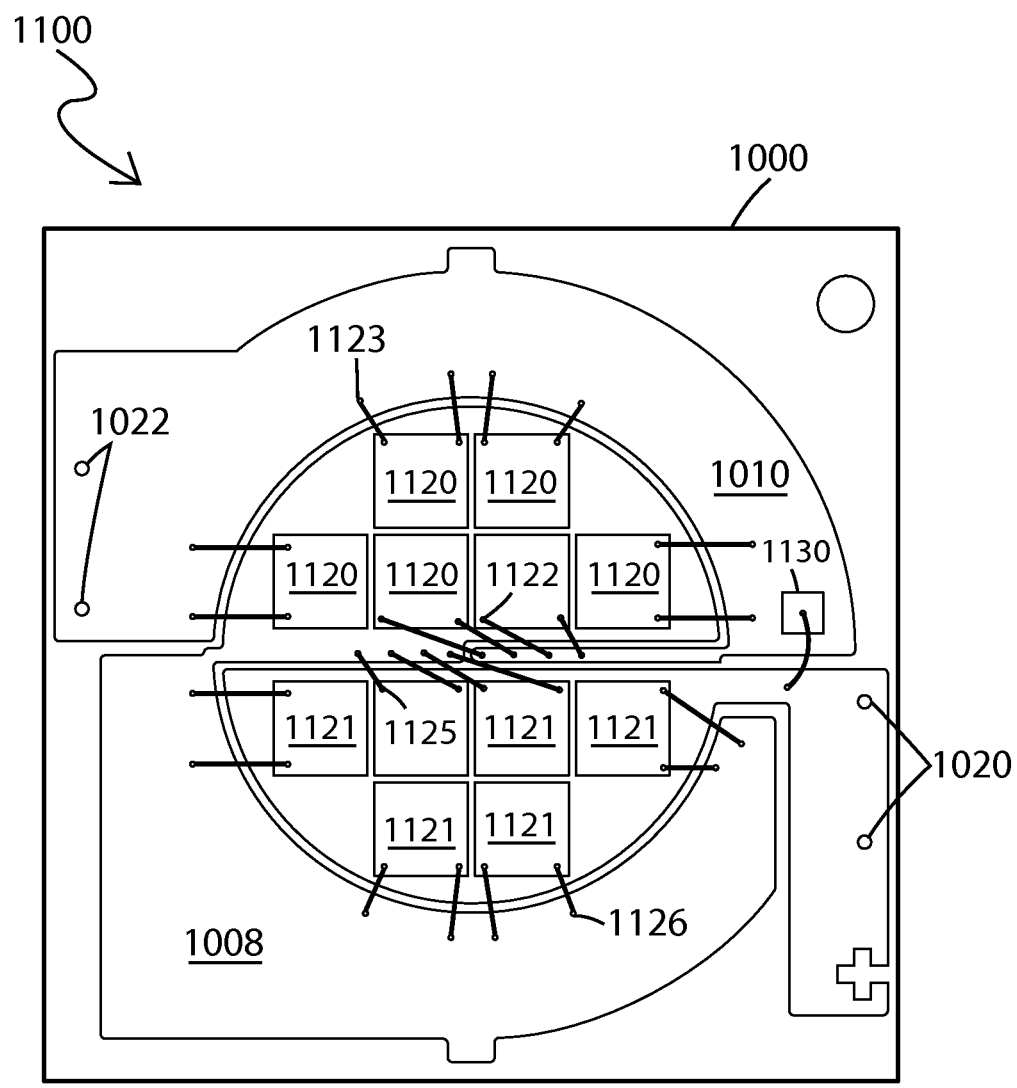
FIGS. 11 and 12 are top-down views of various high density, multi-chip LED devices according to example embodiments of the invention. The embodiments shown in FIGS. 11 and 12 make use of the submount of FIG. 10 and the lens and its distortion are omitted for clarity.

FIG. 11 is a top-down view of an LED device 1100 according to some example embodiments of the invention. LED device 1100 makes use of submount 1000 as described in FIG. 10. LED device 1100 includes twelve LED chips arranged in two groups. Six LED chips 1120 are fastened to metal layer portion 1006 of the submount and are connected in parallel. The anodes are on the bottom of the LED chips 1120 and are in contact with metal layer portion 1006. Six LED chips 1121 are fastened to metal layer portion 1004 of the submount and are also connected in parallel. The anodes of the LED chips 1121 are in contact with metal layer portion 1004.

Still referring to FIG. 11, the cathodes of all of the LED chips are connected by wire bonds to metal layer portions of submount 1000. Wire bonds from the cathodes of LED chips 1120 are connected to metal layer portions of the submount. More specifically, wire bonds 1122 are connected to interconnection rail 1012 of the central bus of submount 1000, and wire bonds 1123 are connected to metal layer portion 1010 of the submount. Wire bonds from the cathodes of LED chips 1121 are also connected to metal layer portions of the submount. More specifically, wire bonds 1125 are connected to a nearby part of metal layer portion 1006 of submount 1000, and wire bonds 1126 are connected to metal layer portion 1008 of the submount 1000.

Staying with FIG. 11, LED device 1100 includes an electrostatic discharge (ESD) protection chip 1130, fastened to metal layer portion 1010 and connected with a wire bond to metal layer portion 1004. Metal layer portion 1004 is connected to the positive terminal of a power source supplying current to the LED device via connection points 1020. Metal layer portion 1010 is connected to the negative terminal of a power source supplying current to the LED device via connection points 1022. The wire bonds connected between the LED chips within each group of six LED chips in LED device 1100 and the submount are arranged so that all the wire bonds in a group are disposed on the outside of the group of six LED chips, allowing the LED chips in a group to be placed close together and this density of the LED chips in a group allows LED device 1100 to be relatively small but still have a relatively high efficiency and output. Also, the patterning of the metal layer portions of the submount together with the arrangement of wire bonds interconnects the LED chips within a group in parallel while the groups themselves are connected in series. Other series and parallel combinations can be implemented.

The LED chips and ESD chip of LED device 1100 of FIG. 11 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 11 for clarity of illustration, but an example lens is discussed later with respect to FIG. 14. Again, an optical element, for example, a lens, may affect light by bending and/or concentrating light rays, by color mixing, or by a combination of these effects. A phosphor could also be used to provide wavelength conversion. In example embodiments, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example, if the maximum width of the LED chips is 5.6 mm, the lens clearance is about 1.7 mm, or about 0.303 the maximum width of the LED chips.

As before, the LED chips in the device of FIG. 11 may be selected from various light color bins to provide a combined light output with a high CRI. In some example embodiments, the lens for an LED device such as LED device 1100 of FIG. 11 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, chips of various sizes may be used. The chips may be about or less than 2000 microns in size, about or less than 1000 microns in size, about or less than 700 microns in size or about or less than 500 microns in size. An LED device like that shown in FIG. 11 may have an efficiency of at least, 80, 85, or 90 lumens/Watt (lm/W) and a CRI of at least 80. The LED device may have an efficiency of about 95 lm/W and a CRI of at least 82. The design of the LED device of FIG. 11 can be adapted so that various types of LED chips could be used, such as direct-bond chips, flip-chips, and chips with substrates made of sapphire, silicon carbide, silicon or other materials. The efficiency of such an LED device with a warm white color, often desired for incandescent replacement lighting, may be as much as about 100 lm/W. However, if the device is binned for a cool white color, an efficiency of as much as about 150 lm/W can be achieved.

Figure 12:
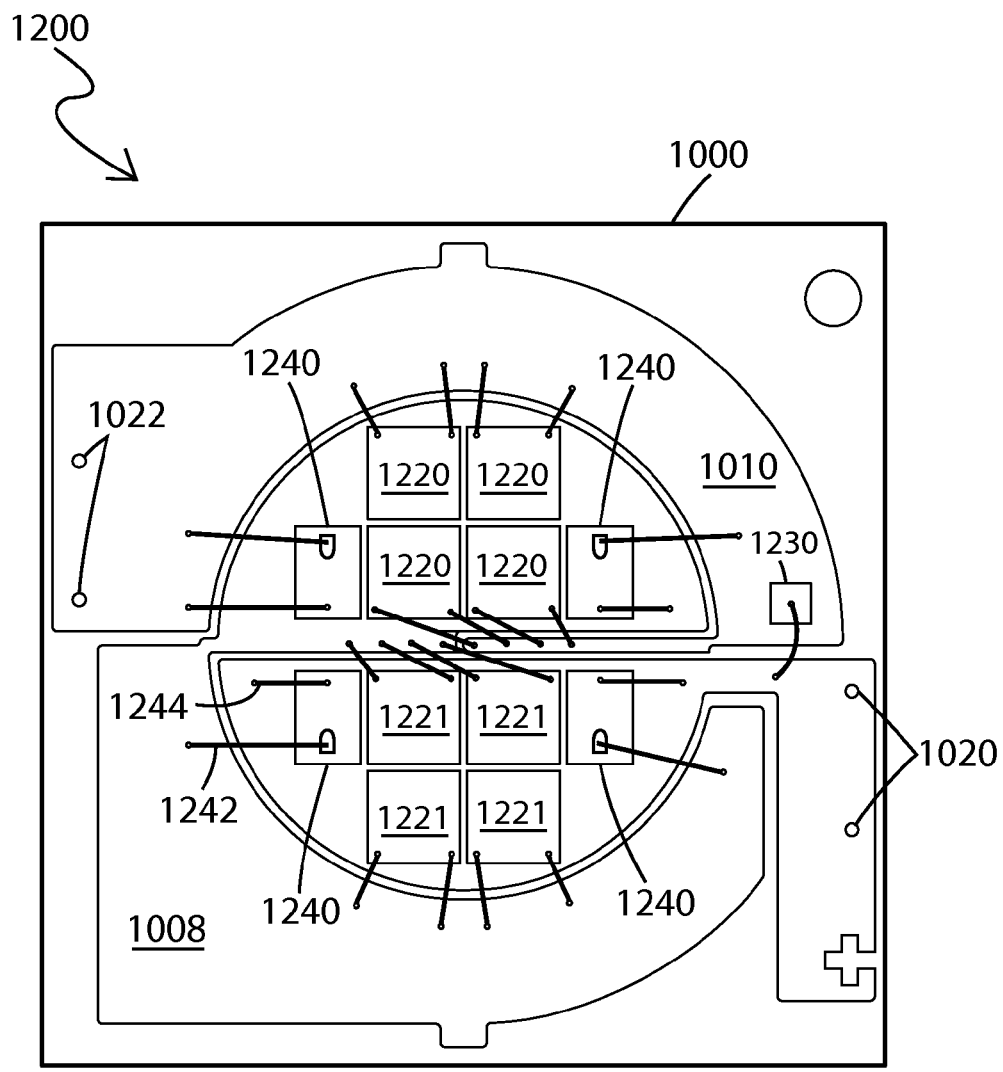

FIG. 12 is a top-down view of an LED device 1200 according to some example embodiments of the invention. LED device 1200 again makes use of submount 1000 as described in FIG. 10. LED device 1200, however, includes two different kinds of LED chips. LED chips 1220 are positioned and connected in the same fashion as the LED chips 1120 in FIG. 11 that were fastened to metal rail 1012. LED chips 1221 are fastened to metal layer portion 1004 of the submount. Device 1200 however, also includes sideview LED chips 1240, each of which has wire bonds connected to the top for both the anode and the cathode. LED chips 1240 are also rectangular in shape instead of square in shape. Wire bonds 1242 connect the anodes and wire bonds 1244 connect the cathodes to the appropriate metal layer portion. Thus, high density LED multi-chip devices according to embodiment of the invention can include different types and shapes of LEDs. Any of various types can be used alone, or different types, sizes and shapes of LEDs can be combined.

Staying with FIG. 12, LED device 1200 includes an electrostatic discharge (ESD) protection chip 1230, fastened to metal layer portion 1010 and connected with a wire bond to metal layer portion 1004. Metal layer portion 1004 is connected to the positive terminal of a power source supplying current to the LED device via connection points 1020. Metal layer portion 1010 is connected to the negative terminal of a power source supplying current to the LED device via connection points 1022. The wire bonds connected between the LED chips within each group of six mixed-type LED chips in LED device 1200 and the submount are again arranged so that all the wire bonds in a group are disposed on the outside of the group of six LED chips, allowing the LED chips in a group to be placed close together and this density of the LED chips in a group allows LED device 1200 to be relatively small but still have a relatively high efficiency and output. Also, the patterning of the metal layer portions of the submount together with the arrangement of wire bonds interconnects the LED chips within a group in parallel while the groups themselves are connected in series. Other series and/or parallel combinations of LEDs are possible with all of the submounts shown in the various embodiments described herein.

As before, device 1200 of FIG. 12 is completed with an optical element placed on top of the device to affect light from the LED chips. Both the optical element and the distortion it would introduce when the device is viewed are omitted in FIG. 12 for clarity of illustration, but an example lens is discussed later with respect to FIG. 14. In an embodiment with mixed chip sizes and shapes, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example, if the maximum width of the LED chips is 5.6 mm, the lens clearance is about 1.7 mm, or about 0.303 the maximum width of the LED chips.

As before, the LED chips in the device of FIG. 12 may be selected from various light color bins to provide a combined light output with a high CRI. In some example embodiments, the lens for an LED device such as LED device 1200 of FIG. 12 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, chips of various sizes may be used. The chips may be about or less than 2000 microns in size, about or less than 1000 microns in size, about or less than 700 microns in size or about or less than 500 microns in size. An LED device like that shown in FIG. 12 may have an efficiency of at least, 80, 85, or 90 lumens/Watt (lm/W) and a CRI of at least 80. The LED device may have an efficiency of about 95 lm/W and a CRI of at least 82. Again, The efficiency of such an LED device with a warm white color, often desired for incandescent replacement lighting, may be as much as about 100 lm/W. However, if the device is binned for a cool white color, an efficiency of as much as about 150 lm/W can be achieved.

Figure 13:
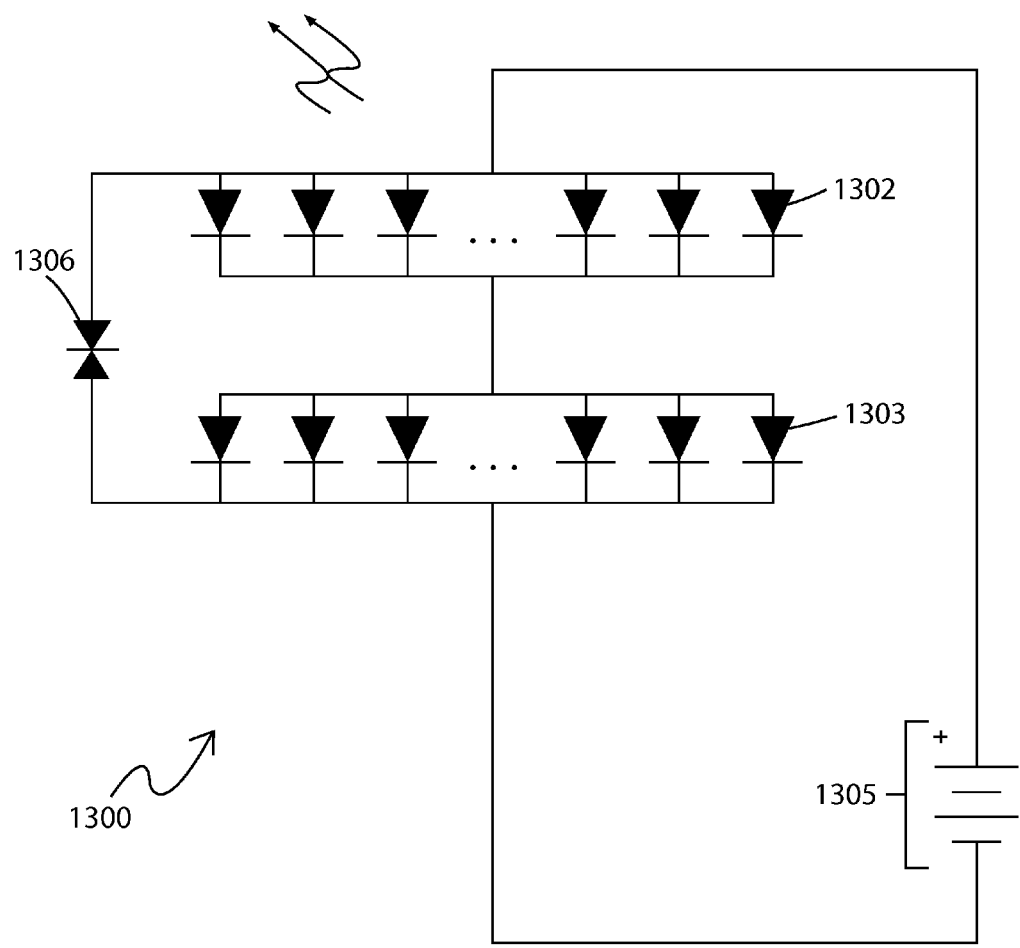
FIG. 13 is a generalized electrical schematic diagram of the LED devices of FIGS. 5-8.

FIG. 13 is a generalized, electronic schematic diagram of the circuit of the LED devices from FIGS. 6-12. Circuit 1300 includes multiple LEDs 1302 connected in parallel to form a first group of LEDs connected in parallel. Multiple LEDs 1303 are connected in parallel to form a second group of LEDs connected in parallel. The two groups of parallel LEDs are in turn connected in series. Current to illuminate the LEDs is supplied by power source 1305. ESD protection device 1306 is connected in parallel across the entire LED circuit spanning both groups of LEDs.

Figure 14:
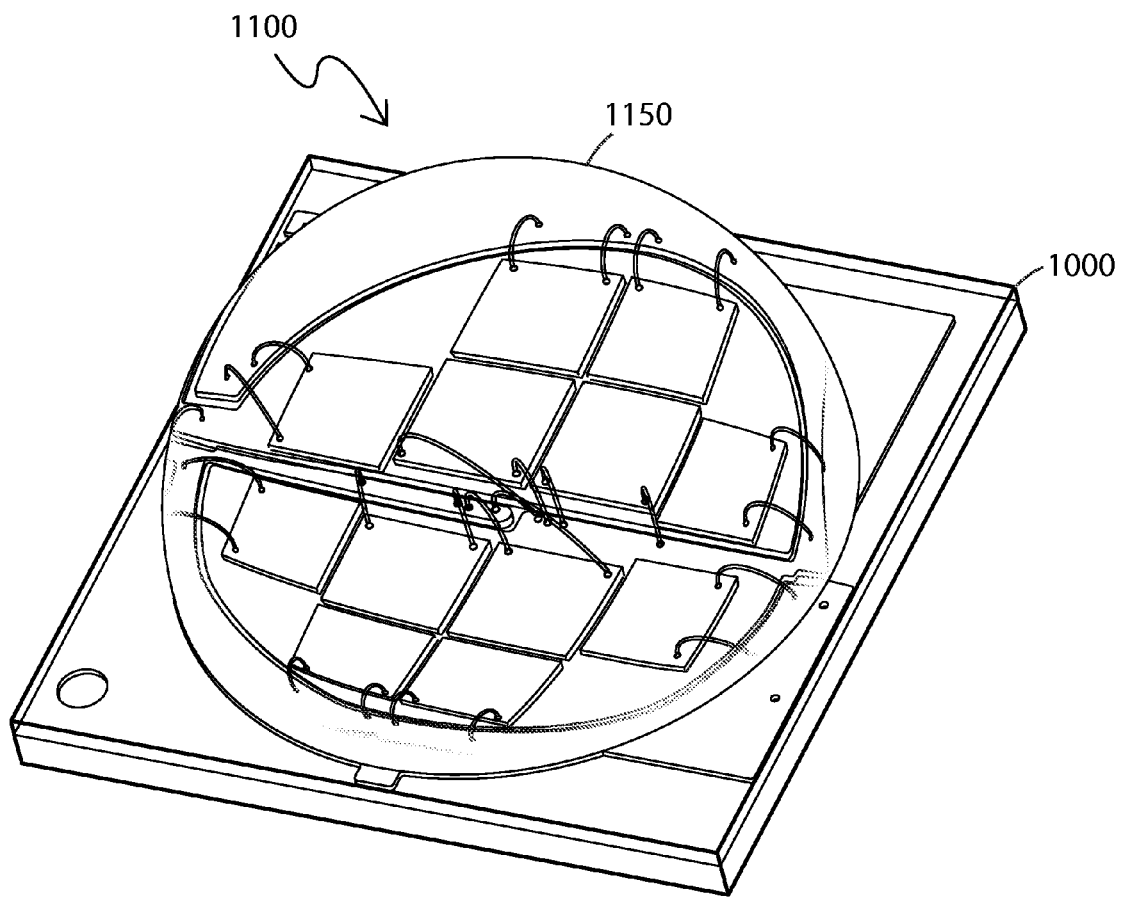
FIG. 14 is a perspective view of a complete high-density multi-chip LED device according to an example embodiment of the invention.

FIG. 14 is a perspective view of LED device 1100 previously shown and described with respect to FIG. 11. In FIG. 14, the optical element, lens 1150 is visible over the two groups of six LED chips and submount 1000. The distortion introduced by the lens can also be seen. In the view of FIG. 14, device 1100 is positioned so that the plus sign in the metal layer is in the top left corner. As previously mentioned a lens for use with an LED device of an embodiment of the invention may be made of glass or plastic, may be molded in place or elsewhere, or otherwise formed or attached to the device as desired. For example, the lens may be molded in place from silicone. FIG. 14 illustrates a lens used with the embodiment of the LED device previously shown in FIG. 11, however, essentially the same type and appearance of lens can be used with any of the embodiments described herein, with appropriate adjustment in the size of the lens for the number of LED chips and size of the substrate used.

Figure 15:
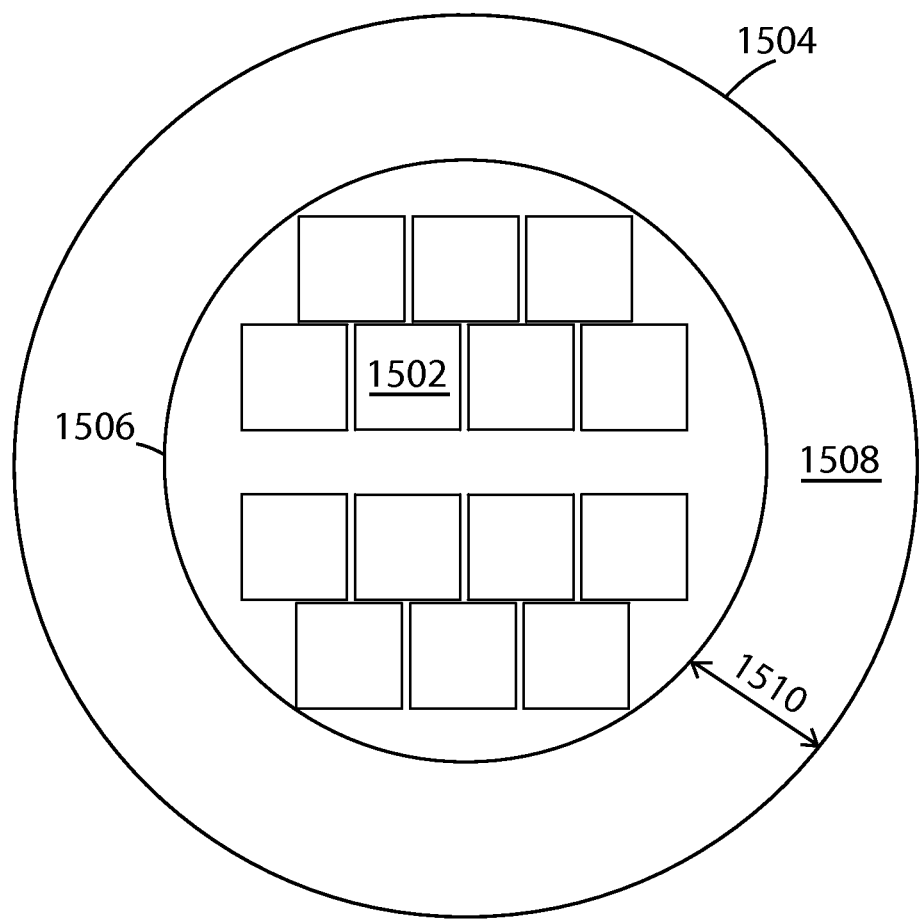
FIG. 15 is a top-down, schematic illustration of an embodiment of the invention indicating how appropriate lens size is determined.

FIG. 15 illustrates the how the clearance between the LED chips and the edge of the lens is determined for embodiments of the invention. The view of FIG. 15 is purely schematic. In this example, fourteen identical LED chips are represented by squares 1502. The outer edge of the lens is represented by circle 1504. Circle 1506 circumscribes the LED chips at their widest point. Area 1508 is the clearance area, with the size of the clearance defined by length 1510. As previously described, this size, in example embodiments, can be approximately 0.2 to 0.8 the maximum width across the LED chips. The clearance can also be from 0.3 to 0.65 the width of the LED chips.

Hi density multi-chip devices as described herein, especially as exemplified by the embodiments shown in FIGS. 5-15 can be made with many types of LED chips. Vertical chips have been used extensively in these embodiments, but flip-chip and sideview chips can also be used, and sideview style chips have also been shown in some of these specific embodiments. Chips with low reabsorption, especially for blue light, can assist in improving light output. Square submounts have been shown, but submounts of various shapes and sizes can be used. Submounts can be ceramic as in previous examples, metal, or plastic. A plastic submount may have a metal slug to aid in heat sinking Various semiconductor materials can be used for the LEDs, including silicon carbide and sapphire. The layouts provide for high-density and very efficient light output in part by placement of wire bonds needed to interconnect the LED chips. The specific submount metal pattern designs minimize light absorption by the submount, and also help increase light output.

The characteristics described above can enable a high-density device light that described to be used in a solid-state replacement for a bright halogen bulb such as the now popular MR16 halogen multi-reflector bulb. In example embodiments, the device size is about 10 mm on a side. It is possible, by the use of smaller LED chips, or fewer, larger LED chips to still achieve very high efficiency in a small package, for example, a package less than 5 mm on a side or less than 3.5 mm on a side. Four 1000-micron LED chips could be replaced with one 2000-micron LED chip. A device could also be scaled to exactly the maximum size that would fit in an LED bulb of a form factor appropriate for a specific incandescent or halogen bulb, such as the previously mentioned MR16 bulb.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. An LED device comprising:
    a submount comprising a base and a patterned metal layer on the base, the patterned metal layer further including at least two semicircular areas of metal;
    at least two groups of LED chips fixed to the submount wherein all the LED chips within a group are connected in parallel to one of the at least two semicircular areas of metal; and
    a plurality of wire bonds, each connected between an LED chip from among the at least two groups of LED chips and the submount, the plurality of wire bonds arranged so that all the wire bonds are disposed on the outside of at least one group of the at least two groups of LED chips and the groups of LED chips are connected in series.

2. The LED device of claim 1 wherein each group comprises six LED chips.

3. The LED device of claim 1 wherein at least one group of LED chips includes LED chips of at least two different sizes.

4. The LED device of claim 3 wherein one size of LED chips is about 1000 microns square and another size of LED chips is about 700 microns or less square.

5. The LED device of claim 3 where one size of LED chips is a vertical LED chip and another size of LED chips is a sideview LED chip.

6. The LED device of claim 1 wherein each group comprises seven LED chips approximately equal in size.

7. The LED device of claim 1 wherein each group comprises eight LED chips.

8. The LED device of claim 1 further comprising an optical element disposed to affect light from the LED chips.

9. A method of assembling a high-density LED device, the method comprising:
    fixing at least two groups of LED chips to a submount, a submount comprising a base and a patterned metal layer on the base, the patterned metal layer further including at least two semicircular areas of metal so that all LED chips within a group are connected in parallel to one of the semicircular areas of metal; and
    connecting a plurality of wire bonds, each between an LED chip from among the at least two groups of LED chips and the submount so that all the wire bonds are disposed on the outside of at least one group of the at least two of LED chips and the groups of LED chips are connected in series.

10. The method of claim 9 further comprising connecting at least some of the wire bonds from each of the two groups of LED chips to a central bus on the base.

11. The method of claim 10 further comprising making the base from alumina.

12. The method of claim 10 further comprising making the base from aluminum nitride.

13. The method of claim 10 wherein at least one group of LED chips includes LED chips of two different sizes.

14. The method of claim 10 further comprising attaching a lens to affect light from the LED chips.

15. An LED device comprising:
    a submount comprising a base and a patterned metal layer on the base, the patterned metal layer further including at least two semicircular areas of metal;
    at least two groups of LED chips fixed to the submount wherein all the LED chips within a group are connected in parallel to one of the at least two semicircular areas of metal, and each of the LED chips within the group has a first terminal connected to the one semicircular area of metal to which the LED chips within the group are fastened; and
    a plurality of wire bonds, each connected between a second terminal of an LED chip from among the at least two groups of LED chips and the submount, the plurality of wire bonds arranged so that all the wire bonds are disposed on the outside of at least one group of the at least two groups of LED chips and the groups of LED chips are connected in series.

16. The LED device of claim 15 wherein each group comprises six LED chips.

17. The LED device of claim 15 wherein at least one group of LED chips includes LED chips of at least two different sizes.

18. The LED device of claim 17 wherein one size of LED chips is about 1000 microns square and another size of LED chips is about 700 microns or less square.

19. The LED device of claim 17 where one size of LED chips is a vertical LED chip and another size of LED chips is a sideview LED chip.

20. The LED device of claim 15 wherein each group comprises seven LED chips approximately equal in size.

21. The LED device of claim 15 wherein each group comprises eight LED chips.

* * * * *